United States Patent [19]

Sanner

[11] Patent Number: 4,994,731
[45] Date of Patent: Feb. 19, 1991

[54] TWO WIRE AND MULTIPLE OUTPUT HALL-EFFECT SENSOR

[75] Inventor: John A. Sanner, Fort Wayne, Ind.

[73] Assignee: Navistar International Transportation Corp., Chicago, Ill.

[21] Appl. No.: 441,687

[22] Filed: Nov. 27, 1989

[51] Int. Cl.[5] .............................................. H03K 17/90
[52] U.S. Cl. .................................... 323/368; 323/231; 323/271; 307/309
[58] Field of Search ............... 323/364, 368, 909, 231, 323/268, 271; 307/309, 415

[56] References Cited

U.S. PATENT DOCUMENTS

| | | | |
|---|---|---|---|
| 3,601,773 | 8/1971 | Frieling et al. | 324/170 |
| 3,660,695 | 5/1972 | Schmitt | 307/309 |
| 3,660,696 | 5/1972 | Rittmann | 307/309 |
| 4,134,030 | 1/1979 | Pace | 307/309 |
| 4,218,659 | 8/1980 | Arai | 330/6 |
| 4,374,333 | 2/1983 | Avery | 323/368 |
| 4,521,727 | 6/1985 | Atherton et al. | 323/368 |
| 4,645,950 | 2/1987 | Carvajal | 307/309 |
| 4,761,569 | 8/1988 | Higgs | 307/309 |

OTHER PUBLICATIONS

Michael Oppenheimer, "In IC Form, Hall-Effect Devices Can Take on Many New Applications", Electronics, Aug. 2, 1971, vol. 44, No. 16, pp. 46-93.

Primary Examiner—Peter S. Wong
Attorney, Agent, or Firm—F. David AuBuchon; Dennis K. Sullivan

[57] ABSTRACT

A device for sensing the speed of a rotating element in a vehicle replaces the practice of using magnetic wire coil pickup devices placed in close proximity to a rotating element, such as a gear. The main speed sensing component is a conventional three lead Hall effect device which produces a voltage each time it is exposed to the presence of a magnetic force which exceeds a predetermined value. The adoption of a device which produces the Hall effect introduces the complication of harmonizing the connection of the three leads of the standard Hall effect device with the connections conventionally found in existing installation of only two leads between the sensing unit and the controlled element. Transistor diode and resistive components mounted in the same housing as the Hall effect device provide a configuration entirely compatible with existing two lead systems.

21 Claims, 3 Drawing Sheets

TWO WIRE AND MULTIPLE OUTPUT HALL-EFFECT SENSOR

BACKGROUND OF THE INVENTION

This invention relates generally to improvements in the use of Hall effect sensors and, in particular, is concerned with a sensor for deriving the rotational velocity of ferrous parts such as are employed in the power train of motor vehicles.

THE PRIOR ART

Hall effect devices are well known for the phenomenon of converting a magnetic flux density into an electric potential. According to this phenomenon, an electric potential can be generated between the edges of a strip of metal or semiconductor through which an electric current is flowing longitudinally, when a magnetic field cuts the plane of the strip at right angles. The magnitude of the effect is measured by the Hall coefficient (Rh) which is given by $$R_h = E_y/J_x H_z$$

where $E_y$ is the transverse electric field, $J_x$ is the longitudinal current density, and $H_z$ is the vertical magnetic field.

Further well known is the fact that one conventional Hall effect chip is made up as a three lead device. One lead serves as a connection to ground, a second is connected to the voltage supply, and a third carries the output or control voltage. When considering that one current practice for sensing the drive shaft speed of heavy duty vehicles involves a two-lead device comprising a magnetic wire coil pickup mounted in closely spaced relationship to a rotating gear, the substitution of a Hall effect sensor for the two-wire prior art methods introduces complications because of the inherent three lead connections necessary for a workable installation. Thus, when contemplating substitution of Hall effect sensors for the standard magnetic wire coil pickup, extensive modification in the vehicle wiring harness must be expected in order to accommodate the additional, i.e., third lead, emerging from the housing of the remotely located sensor. The achievement of such a substitution will result in a number of improvements including better sensing at low shaft speeds, improved noise immunity, and an improvement in reliability due to fewer leads.

Experimentation to achieve a two-lead Hall effect sensor has been conducted in the past and has resulted in the form shown in U.S. Pat. No. 4,645,950 to Carvajal. In the patented system, the sensor 10 has a combined voltage supply and output terminal 12 and a ground or reference terminal 14. Connected between these two terminals are a Hall effect device 16, a comparator 15, and a voltage/current converter 20 such that the device 16 supplies a first signal to comparator 15 when it senses a magnetic field strength above a predetermined amount, and supplies a second signal to the comparator in the absence of the magnetic field strength. The comparator 15 in turn supplies either a first voltage state or a second voltage state to the converter 20. The converter then converts the first voltage state into a first current appearing at terminal 12, indicating the sensing of a magnetic field and similarly converts the second voltage state to a second current, indicating a weak or absent magnetic field. While no doubt exists as to the objective sought in the Carvajal system, its arrangement suffers from a number of weaknesses including an unusually large numbers of circuit components required to obtain the Hall effect output current fluctuations. In an era of tightening production costs and a search for economics both in terms of size and space there exists a need for a Hall effect sensing unit in the transportation industry which has one less than the three leads generally associated with state-of-the art Hall effect sensors.

SUMMARY OF THE INVENTION

The Hall effect device of the present invention comprises an arrangement of components which, in a vehicle shaft speed sensing environment, converts a conventional three terminal Hall effect sensor into one which is reduced to two output terminals at the point where it emerges from the housing of the speed sensitive device. The invention is employed advantageously in any situation where it is wished to employ Hall effect chips as substitutes for two-wire magnetic wire coil pickups without sacrificing any accuracy or reliability and avoiding extensive and thus costly modification to accommodate the extra or third lead common to Hall devices in general. Moreover, the arrangement embodying the invention also senses the rotational velocity of a vehicle shaft in a manner improved over the prior art system of using a dual coil magnetic pickup wound on a single core and housed in a common case. Other advantages of an alternative include the development from a Hall effect device of dual outputs supplied by a single Hall effect package.

Accordingly, an object of the invention is to improve apparatus for sensing the rotational speed of drive train components in the propulsion system of motor vehicles such as trucks.

Another object of the invention is to sense speed in a system which incorporates an improved Hall effect device.

A further object of the invention is to sense speed with improvement in the region of low rotational speeds, and which offers improved accuracy and immunity to noise.

Another feature of the invention is the novel use of a Hall effect device which easily and economically can be incorporated into speed sensing systems which currently use two terminal configurations between the remote speed sensor and the control elements or panel.

Still another feature characterizing the present invention is the construction of a Hall effect pickup system which provides multiple vehicle control outputs from a single physical installation.

Other objects of the invention will become apparent from the following description of the embodiments of the present invention taken in conjunction with the accompanying drawings.

BRIEF DESCRIPTION OF THE DRAWINGS

The same reference characters refer to the same elements throughout the several embodiments of the invention.

DESCRIPTION OF THE PREFERRED EMBODIMENTS

Figure 1:
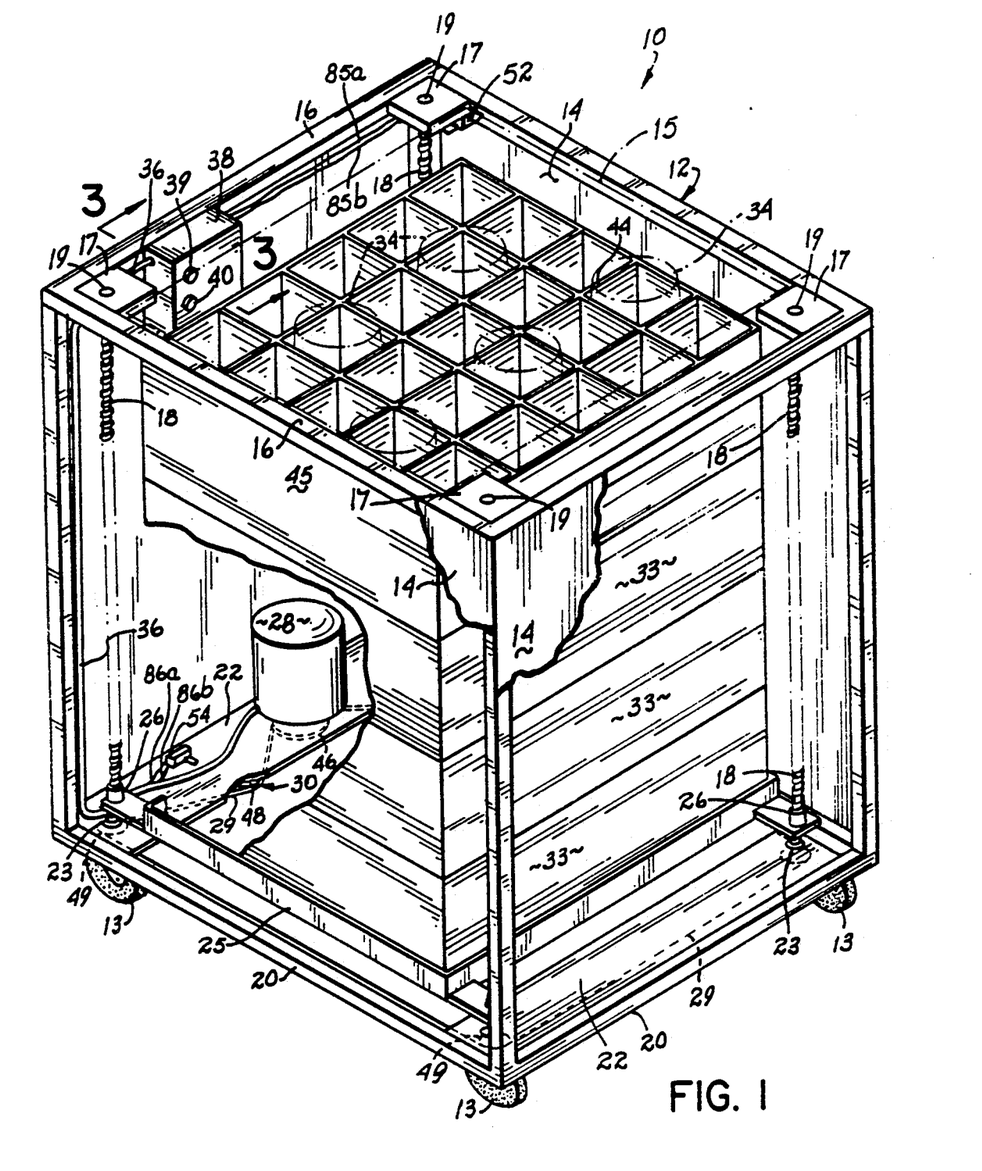
FIG. 1 illustrates an electrical schematic of the invention in one specific embodiment thereof.

Referring now to FIG. 1, the reference character 10 generally designates a sensing unit or housing which encloses a standard three-terminal Hall effect device 12 which preferably is in the form of a semiconductor chip of the type commercially available from standard sources. The sensing unit 10 in the preferred embodiment is understood to be located by or mounted in close proximity to a moving mechanical element, not shown, such as a cam shaft gear or tone wheel for which it is desired to derive a control signal indicative of rotational speed. Such control signals as will readily be appreciated by those skilled in the art are made available at the instrument end of the circuit for purposes of automatically controlling engine or instrumentation operation.

Within sensing unit 10 a ground line 14 is coupled to one terminal of Hall effect device 12 while a second terminal thereof is shown coupled to a voltage supply line and output lead 16 through a voltage regulator 15. The third terminal of device 12 is connected to the base of a transistor 20 which has its emitter returned to ground line 14. Although in FIG. 1 the regulator 15 is shown schematically as an element separated physically from the Hall effect device 12, it will be appreciated that in actual practice the regulator 15 may be internal to and made a part of the substrate of device 12 and, as such, is capable of regulating over a range of approximately 6.5 to 18 volts.

The line 16 is coupled through a resistor 22 to a standard source of voltage $V_{cc}$. One end of a resistor 24 is connected to the collector of transistor 20 and its other end is connected to line 16. Also preferably within the sensing unit 10, and connected directly between lines 14 and 16, is a Zener diode 26 for providing overvoltage protection for Hall effect device 12. The output signal from sensing unit 10 is taken from line 16 and, as shown herein, is represented by a waveform designated generally by the reference character 28. Further as shown in FIG. 1, the range of the output signal 28 may extend from the value of $V_{cc}$ itself to a lower potential above ground level.

In the preferred embodiment, it will be understood that when the Hall effect device 12 is exposed to a magnetic field whose intensity exceeds a predetermined value, the Hall effect causes transistor 20 to conduct and such conducting state occurs each time the sensing device 12 registers the passage of a rotating element whose RPM is to be precisely controlled.

Figure 2:
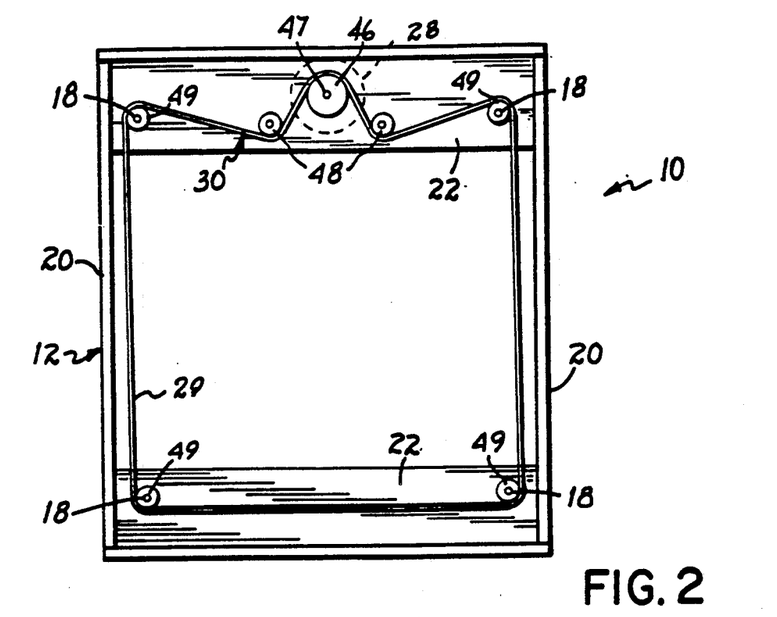
FIGS. 2 and 3 are schematic circuits which describe variations of the specific embodiment illustrated in FIG. 1.

FIG. 2 illustrates an electrical schematic of the present invention which is identical to the arrangement of FIG. 1 in every respect except that a Zener diode 30 is substituted for the resistor 24 between the voltage supply line and the collector of transistor 20. Acceptable results have been found from having the breakdown voltage of diode 30 greater then the minimum regulation limit of the internal regulator of Hall effect device 12.

Figure 3:
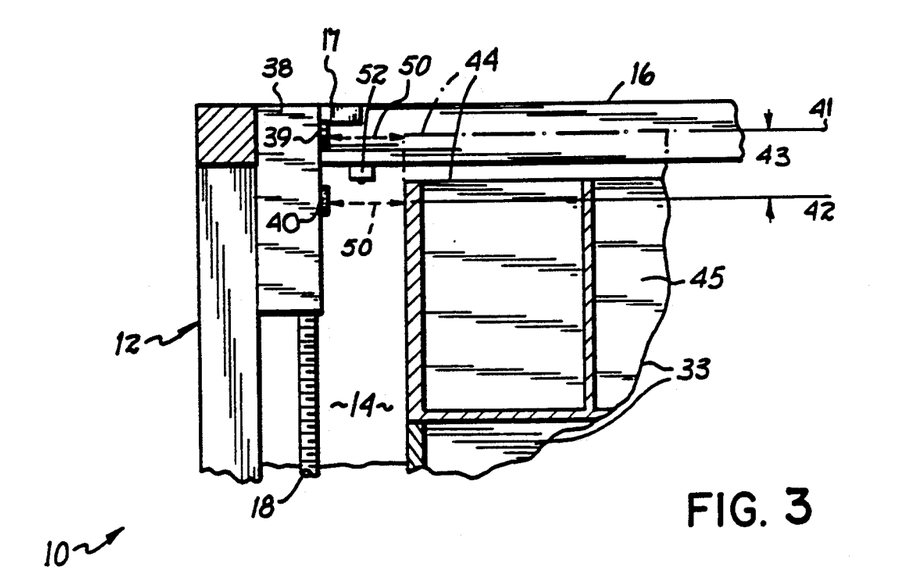
Figure 4:
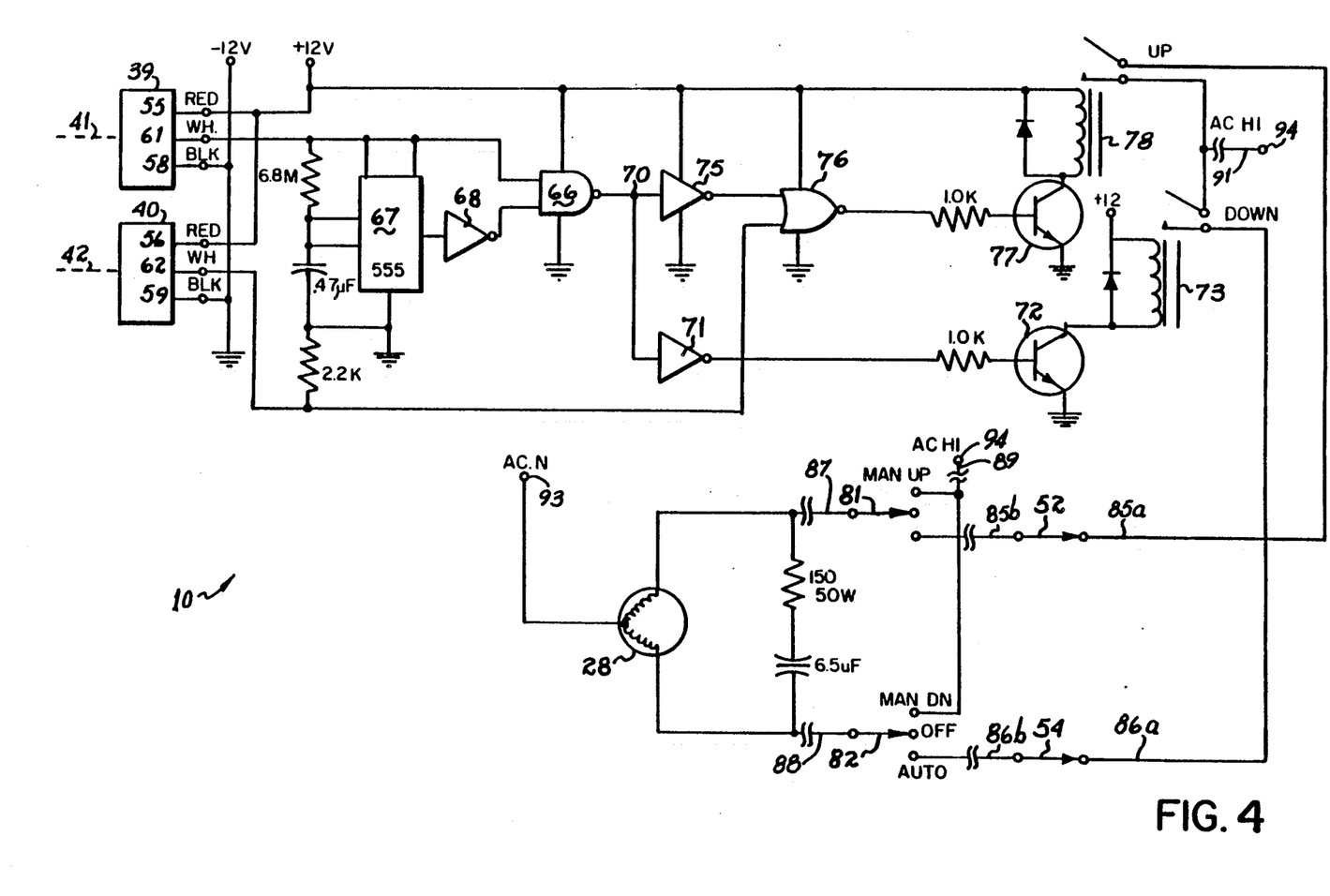

Referring now to the embodiment of the invention as shown in FIG. 3, the sensing unit 10 includes a ground line 32 coupled to one terminal of a Hall effect device 34 which has a second terminal coupled to a voltage supply line 36 through a voltage regulator 38. A source $V_{cc}$ of voltage is connected to the line 36 through a resistor 40. As was explained previously in reference to the circuits shown in FIGS. 1 and 2, the regulator 38 may be assumed to form an integral part of the Hall effect chip 34 and, as such, is capable of regulating over a range of approximately 6.5 to 15 volts. The third terminal of the device 34 is connected to the base of a transistor 42 which has its emitter returned to ground line 32. The collector of transistor 42 is connected to the junction 44 of two resistors 46 and 48 and thus through resistor 46 is connected to line 36 and through resistor 48 is coupled to the base of a second transistor 50 whose emitter is returned to ground line 32. Also within the sensing unit 10, in FIG. 3, and connected across lines 32 and 36, is a Zener diode 52 for providing overvoltage protection for the Hall effect device 34.

The collector of transistor 50 is returned to the source $V_{cc}$ through a series circuit which includes a resistor 54, voltage supply line 56, and a resistor 58. The line 56 associated with transistor 50 extends into a first output signal line 60 whose output is designated generally by the reference character 62. In a similar manner, the line 36 which is associated with transistor 42 extends into a second output signal line 64 whose output is designated generally by the reference character 66.

OPERATION

With respect to the embodiment shown in FIG. 1, it will be assumed that resistors 22 and 24 are of the same value although being rated the same is not an absolute requirement. When no output voltage is being generated by the Hall effect device 12, no collector current is flowing in transistor 20 and, as a result, the value of the output signal on line 16 is essentially equal to the voltage $V_{cc}$. At the point where an output voltage is generated by device 12, the voltage at the base-emitter junction of transistor 20 causes the flow of current. The division of voltage across resistors 22 and 24 causes the voltage appearing on line 16 to drop to a level which is approximately one-half the value of $V_{cc}$. The variations in the voltage appearing on line 16 may be applied in conventional fashion at the instrument end of the system as will be appreciated by those skilled in the art of industrial control.

As will readily be appreciated, therefore, by the adoption of the embodiment illustrated in FIG. 1, a conventional three terminal Hall effect device is adapted for connection to a configuration which has only two wires available for connection to the sensing unit 10. This avoids the necessity of having to make extensive modifications to the wiring in the vehicle itself in order to match up with the conventional two wire magnet coil pickups or buffer/amplifiers currently being used in many installations.

The arrangement in FIG. 2 includes the replacement of the resistor 24 by the Zener diode 30, as previously described, with the requirement imposed of having the breakdown voltage of diode 30 greater than the minimum regulation limit of the internal regulator of Hall effect device 12. The effect of the Hall device on transistor 20 in FIG. 2 is the same as described in the operation of the circuit in FIG. 1 so that, when the transistor 20 is triggered into conduction as the result of the Hall effect, the voltage in the form of output signal 28 falls from $V_{cc}$ approximately to the regulation voltage of diode 30. Optimum results have been achieved in the circuit embodied in FIG. 3 with 12 volts assigned as value of $V_{cc}$ and the diode 30 having a regulation on the order of six volts. Therefore, a signal of about six volts will appear on line 16 each time a magnetic impulse at sensing unit 10 exceeds a predetermined value. The employment in FIG. 2 of Zener diode 30 and the collector circuit of transistor 20 has the advantage of allowing a substantially wide swing of the output signal by dispensing with the need to assign to resistor 22 a low level normally associated with a simple resistance voltage divider network.

In the embodiment shown in FIG. 3, prior to the point that the Hall effect device generates an output signal, the voltage which appears on terminal 60 is less than $V_{cc}$ and the output voltage seen on terminal 64 is at the value of $V_{cc}$. As previously set forth, the Hall effect voltage induced in device 12 by the element having its rotary speed monitored causes transistor 42 to conduct, thereby interrupting the flow of current in transistor 50. The circuit of FIG. 3 thus consists of two cascaded stages with an output taken from each inverted in phase with respect to each other substantially by 180 degrees. It has been found in practice that the phase inversion of the output voltages, as represented by wave forms 62 and 66, has the unexpected advantage of overcoming the effect of any noise interference which may occur between the instrumentation end of the system and the sensing unit 10. Inasmuch as any noise fluctuations which infiltrate the terminal 62 and 66 will equal each other and spontaneously occur in different directions, they have the effect of cancelling each other thereby eliminating feedback problems associated with noise.

It will be understood that the invention is not limited to the embodiments described above, it being apparent to those skilled in the art that various changes and modifications may be made without departing from the spirit of the invention or the scope of the appended claims.

I claim:

1. In a controller for driving vehicle instrumentation and electronic engine controls, a speed sensing unit having a first output terminal coupled to a DC voltage supply circuit and a second terminal connected to ground, a three-lead Hall effect element within said unit having one lead thereof connected to said first terminal and a second lead thereof connected to said second terminal, switching means coupled to the third lead of said Hall effect element and to said second terminal for sensing each time said element is exposed to a magnetic field which exceeds a predetermined value, impedance means connected between said first terminal and said switching means, said switching means supplying to said first terminal a periodically varying voltage whose instantaneous value is directly related to the frequency of appearance of said magnetic field, and means connected between said first and second terminals for providing overvoltage protection for said Hall effect element.

2. In a controller according to claim 1, wherein said switching means is a transistor.

3. In a controller according to claim 2, wherein the base of said transistor is connected to said third lead of said Hall effect element and the emitter thereof is connected to said second terminal.

4. In a controller according to claim 1, wherein said impedance means is a resistor.

5. In a controller according to claim 1, wherein said impedance means is a Zener diode.

6. In a controller according to claim 1, wherein said means for providing overvoltage protection for said Hall effect element is located within said unit.

7. In a controller according to claim 6, wherein said means for providing overvoltage protection is connected between said first and second terminals.

8. In a controller according to claim 1, wherein said means for providing overvoltage protection is a Zener diode.

9. In a controller for driving vehicle instrumentation and electronic engine controls, a speed sensing unit having a first terminal connected to a DC voltage supply circuit and a second terminal connected to ground, a three-lead Hall effect element within said unit having one lead thereof connected to said first terminal and a second lead thereof connected to said second terminal, first switching means coupled to the third lead of said Hall effect element and to said second terminal for sensing each time said Hall effect element is exposed to a magnetic field which exceeds a predetermined value, impedance means connected between said first terminal and said first switching means, said first switching means supplying to first terminal a periodically varying voltage whose instantaneous value is directly related to the frequency of appearance of said magnetic field, means connected between said first and second terminals for providing overvoltage protection for said Hall effect element, a third terminal at said speed sensing unit, and second switching means connected between said third terminal and said first switching means for supplying to said third terminal a voltage which is substantially 180 degrees out of phase with the voltage supplied to said first terminal by said first switching means.

10. In a controller according to claim 9, wherein said first and second switching means are transistors.

11. In a controller according to claim 10, wherein the emitter of each of said transistors is connected to said second terminal.

12. In a controller according to claim 10 wherein said first and second transistors are connected in cascade.

13. In a controller according to claim 9, wherein said impedance means is a resistor.

14. In a controller according to claim 9, wherein said means for providing overvoltage protection for said Hall effect is located within said unit.

15. In a controller according to claim 14, wherein said means for providing overvoltage protection for said Hall effect is connected between said first and second terminals.

16. In a controller according to claim 9, wherein said means for providing overvoltage protection is a Zener diode.

17. In a controller for driving vehicle instrumentation and electronic engine controls, a speed sensing unit having first and second terminals connected to a DC voltage supply circuit and to ground, respectively, and having a third terminal, said unit comprising;

a three-lead Hall effect element within said unit having one lead thereof connected to said first terminal and a second lead thereof connected to said second terminal;

a first transistor at its base connected to the third lead of said Hall effect element and connected by its emitter to said second terminal;

first impedance means for coupling the collector of said first transistor to said first terminal; second impedance means for connecting the base of said second transistor to the collector of said first transistor;

said second transistor at its emitter being connected to said second terminal;

second impedance means for coupling the collector of said second transistor to said third terminal;

said first and second transistors being arranged to provide on said first and third terminals control voltages which have a relationship with each other substantially 180 degrees out of phase;

and means connected between said first and second terminals for providing overvoltage protection for said Hall effect element.

18. In a controller according to claim 17, wherein said means for providing overvoltage protection is located within said unit.

19. In a controller according to claim 17, wherein said means for providing overvoltage protection is a Zener diode.

20. In a controller according to claim 17, wherein said first and second impedance means are resistors.

21. In a controller according to claim 17 wherein said first and second transistors are connected in cascade.

* * * * *

UNITED STATES PATENT AND TRADEMARK OFFICE
CERTIFICATE OF CORRECTION

PATENT NO. : 4,994,731

DATED : February 19, 1991

INVENTOR(S) : JOHN A. SANNER

It is certified that error appears in the above-identified patent and that said Letters Patent is hereby corrected as shown below:

The title page, showing the illustrative figure, and 3 Drawing Sheets should be deleted and substitute therefor the attached title page and 2 Drawing Sheets (FIGS. 1-3).

Signed and Sealed this

Twenty-third Day of February, 1993

Attest:

STEPHEN G. KUNIN

*Attesting Officer*   *Acting Commissioner of Patents and Trademarks*

United States Patent [19]

Sanner

[11] Patent Number: 4,994,731
[45] Date of Patent: Feb. 19, 1991

[54] TWO WIRE AND MULTIPLE OUTPUT HALL-EFFECT SENSOR

[75] Inventor: John A. Sanner, Fort Wayne, Ind.

[73] Assignee: Navistar International Transportation Corp., Chicago, Ill.

[21] Appl. No.: 441,687

[22] Filed: Nov. 27, 1989

[51] Int. Cl.[5] .......................................... H03K 17/90
[52] U.S. Cl. .................................. 323/368; 323/231; 323/271; 307/309
[58] Field of Search ............... 323/364, 368, 909, 231, 323/268, 271; 307/309, 415

[56] References Cited

U.S. PATENT DOCUMENTS

| | | | |
|---|---|---|---|
| 3,601,773 | 8/1971 | Frieling et al. | 324/170 |
| 3,660,695 | 5/1972 | Schmitt | 307/309 |
| 3,660,696 | 5/1972 | Rittmann | 307/309 |
| 4,134,030 | 1/1979 | Pace | 307/309 |
| 4,218,659 | 8/1980 | Arai | 330/6 |
| 4,374,333 | 2/1983 | Avery | 323/368 |
| 4,521,727 | 6/1985 | Atherton et al. | 323/368 |
| 4,645,950 | 2/1987 | Carvajal | 307/309 |
| 4,761,569 | 8/1988 | Higgs | 307/309 |

OTHER PUBLICATIONS

Michael Oppenheimer, "In IC Form, Hall-Effect Devices Can Take on Many New Applications", Electronics, Aug. 2, 1971, vol. 44, No. 16, pp. 46-93.

Primary Examiner—Peter S. Wong
Attorney, Agent, or Firm—F. David AuBuchon; Dennis K. Sullivan

[57] ABSTRACT

A device for sensing the speed of a rotating element in a vehicle replaces the practice of using magnetic wire coil pickup devices placed in close proximity to a rotating element, such as a gear. The main speed sensing component is a conventional three lead Hall effect device which produces a voltage each time it is exposed to the presence of a magnetic force which exceeds a predetermined value. The adoption of a device which produces the Hall effect introduces the complication of harmonizing the connection of the three leads of the standard Hall effect device with the connections conventionally found in existing installation of only two leads between the sensing unit and the controlled element. Transistor diode and resistive components mounted in the same housing as the Hall effect device provide a configuration entirely compatible with existing two lead systems.

21 Claims, 2 Drawing Sheets